(12) United States Patent
Pedersen et al.

(10) Patent No.: US 7,248,089 B2
(45) Date of Patent: Jul. 24, 2007

(54) METHOD OF ESTABLISHING A PWM-MODULATED OUTPUT SIGNAL REPRESENTATION

(75) Inventors: Kim Rishøj Pedersen, Egå (DK); Lars Arknæs-Pedersen, Viby J (DK)

(73) Assignee: TC Electronic A/S (DK)

( * ) Notice: Subject to any disclaimer, the term of this patent is extended or adjusted under 35 U.S.C. 154(b) by 17 days.

(21) Appl. No.: 10/563,704

(22) PCT Filed: Jul. 7, 2003

(86) PCT No.: PCT/DK03/00475

§ 371 (c)(1),
(2), (4) Date: Jan. 5, 2006

(87) PCT Pub. No.: WO2005/004330

PCT Pub. Date: Jun. 3, 2005

(65) Prior Publication Data

US 2006/0152264 A1 Jul. 13, 2006

(51) Int. Cl.
*H03K 3/017* (2006.01)
(52) U.S. Cl. ...................... 327/172; 332/109
(58) Field of Classification Search ............ None
See application file for complete search history.

(56) References Cited

U.S. PATENT DOCUMENTS

| | | | |
|---|---|---|---|
| 4,617,675 A | 10/1986 | Ashikaga et al. ........... 375/238 |
| 5,140,611 A * | 8/1992 | Jones et al. ................. 375/219 |
| 5,623,219 A | 4/1997 | Karraker ..................... 327/50 |
| 5,917,369 A | 6/1999 | Nguyen ....................... 330/10 |
| 6,107,876 A * | 8/2000 | O'Brien ....................... 330/10 |

OTHER PUBLICATIONS

International Search Report; PCT/DK03/00475; Feb. 25, 2004.

* cited by examiner

*Primary Examiner*—Timothy P. Callahan
*Assistant Examiner*—Cassandra Cox
(74) *Attorney, Agent, or Firm*—Cantor Colburn LLP

(57) ABSTRACT

The invention relates to a method of establishing a PWM-modulated output signal representation (OS), providing a stream of parallelly determined intersection representations (PIR) on the basis of a stream of parallel reference signal representation (PRSR) and an input signal (IS), establishing a serial PWM output signal representation (OS) by transforming said stream of parallelly determined intersection representations (PIR) into a stream of serial intersection representations (SIR) by means of a relative time shift of at least one of said parallelly determined intersections (PIR). According to an embodiment of the invention, an advantageous way of providing intersection estimates has been obtained, as each or at least a number of intersection estimates between a reference signal and an input signal may be established partially while taking only the individual partial reference functions into consideration.

16 Claims, 13 Drawing Sheets

METHOD OF ESTABLISHING A PWM-MODULATED OUTPUT SIGNAL REPRESENTATION

FIELD OF THE INVENTION

The invention relates to a method of establishing a PWM modulated output signal representation (OS) according to claim 1.

BACKGROUND OF THE INVENTION

Pulse width modulation, PWM, is used widely within the field of for instance audio amplifiers. Generally, the available pulse width modulation techniques may be categorized into typically three different types of modulation, natural pulse width modulation, NPWM, uniform pulse width modulation, UPWM or linearized pulse width modulation, hereinafter LPWM.

Generally, all pulse width modulation implies the technique of transforming or converting an input signal into an output square wave signal having a certain pulse width, at least partly defined by the input signal by comparison of the input signal to a reference signal.

A short review of the general understanding of the above-mentioned groups of pulse width modulation techniques will be given below.

Natural pulse width modulation, NPWM, typically implies the comparison of a continuous time signal, typically an analogue waveform signal, to a reference signal, typically a sawtooth signal. The output signals will then switch between typically two output levels when the input signal and the reference signal intersect.

The natural pulse width modulation technique, NPWM, is generally regarded as distortion free within the audio band.

Uniform pulse width modulation, UPWM, typically implies the comparison of a discrete time signal, typically a digital waveform signal such as a PCM signal, to a reference signal, typically a sawtooth signal. The output signals will then switch between typically two output levels when the input signal and the reference signal intersect. A well-known problem related to uniform pulse width modulation, UPWM, is that the input signal, due to its discrete nature, may basically not necessarily be represented at the time of intersection. This problem may be dealt with in different ways, e.g. simply by accepting the error and quantizing the intersection time according to a quantizing algorithm.

In order to counteract the inherent distortion, several PWM linearization techniques have been disclosed within the art.

Linearized pulse width modulation, LPWM, typically deals with emulation of the theoretical value of the input signal, if a sample of the input signal was actually present at the time of intersection between the reference signal and the input signal.

Such methods are often referred to as linearized pulse width modulation, LPWM. Prior art demonstrates linear interpolation between two adjacent input samples to achieve the output pulse width. In other words, the linearization algorithms typically operate on more than one sample of the input signal to determine the linearized output pulse width.

Thus several linearization techniques apply to first order interpolation of the input signal between the discrete samples in order to estimate the true cross point between the input signal and the reference signal.

Other techniques implying 2nd order interpolation have been applied for the purpose of coming closer to the "true" cross point, thereby minimizing the resultant harmonic distortion.

A problem of many of the relatively new and improved LPWM techniques is that the resulting improvement is relatively costly with respect to computing requirements. Thus, several linearized pulse width modulation techniques require division.

Typically, prior art LPWM-techniques either do not include an algorithm to determine the pulse width, or they disadvantageously use a division operation to compute the pulse width. Division operations are relatively computationally inefficient in digital signal processing and require many more computation steps than for example addition or multiplication operations. An additional silicon area is therefore required to implement techniques involving division. Generally known implementations do not provide computationally efficient methods to reduce harmonic distortion in pulse width modulated systems.

It is an object of the invention to provide a method, which may be applied in a PWM modulation technique featuring low distortion and computationally efficiency.

SUMMARY OF THE INVENTION

The invention relates to a method of establishing a PWM-modulated output signal representation (OS), providing a stream of parallelly determined intersection representations (PIR) on the basis of a stream of parallel reference signal representations (PRSR) and an input signal (IS), establishing a serial PWM output signal representation (OS) by transforming said stream of parallelly determined intersection representations (PIR) into a stream of serial intersection representations (SIR) by means of a relative time shift of at least one of said parallelly determined intersections (PIR).

According to an embodiment of the invention, an advantageous way of providing intersection estimates has been obtained, as each or at least a number of intersection estimates between a reference signal may be established partially while taking only the individual partial reference functions into consideration.

The partial reference signals may also within the scope of the invention be referred to as parallel reference signal representation.

It is noted that a stream of parallel reference signal representations (PRSR) may both refer to a physical real signal or, preferably, a representation of a desired reference signal.

It is noted that the phrase parallelly determined intersection representation primarily relates to a desired reference signal, which has been modified, primarily by a time transformation, into a number of signal representations, having advantageous properties with respect to subsequent signal processing. In particular, an advantageous property may refer to that of transforming a reference signal representation into signal representations, which may each relatively easily be solved when determining intersections between an input signal and the reference signal components. This advantageous reference signal representation may also be understood as a "packed" reference signal, which when being packed may undergo processing, e.g. for the purpose of comparing the reference signal representation to an input signal representation, and then afterwards may be "unpacked" by a relatively simple "unpacking-technique", which when applied maintains or substantially maintains the information obtained during the processing on the basis of the "packed" signal representation.

A further property of the handling a the parallelly determined intersections representation is that it may be dealt with truly parallel, i.e. by performing the computing related to each part of the parallel representation in parallel. It should, however, be emphasized that the computing related to the finding and transformation of intersections may also be performed serially if desired, i.e. one by one.

It is noted that the stream of serial intersection representations itself may be represented in various representation containing formats, serial or parallel. However, even though the representation may be held in a kind of parallel representation, the serial intersection representations will refer to a serial time base.

According to an embodiment of the invention, the intended reference signal may be kept in a parallel signal representation, according to which the different parallel signal representations forming the complete reference signal may be kept in an advantageous representation. In other words, the intended signal, e.g. a double-sided triangular reference signal may be established as two parallel linear functions, one function representing the linear rising part of the triangle wave the other function representing the falling linear triangular wave of the reference function. In this way, the different parts of the complete signal may be transformed into a function, which may independently be compared to the input signal. An example of such advantageous representation is to transform the time axis of the two "independent" functions by simply adding and subtracting a delay, thereby obtaining that both of the parallel symmetrical functions are symmetrical with respect to time=0. In this way, an intersection may be determined in a relatively simple manner, as the necessary mathematical computing may be simplified when the function is symmetrical. Subsequently, the established intersection estimates may be transformed by applying more or less complex transformation algorithms. It should, however, be noted that the transformation may typically be performed by a transformation in time which is substantial compared to the period of the intended reference signal.

According to an embodiment of the invention the established resulting—global—time shift may in principle be any time shift equal or greater than zero. It is, however, noted that the time shift, depending on how the calculations are analyzed, may in fact be regarded as negative if each time estimate is automatically delayed by a predefined initial delay in order to facilitate steady computing. If this is the case, as it typically is, the effective and principal idea of applying the time transformation scheme is to apply a certain offset between a number of determined intersection estimates, thereby offering the system to establish and perform the main processing in another time domain than the resulting serial true time PWM signal.

According to an embodiment of the invention, the parallel reference signal may be computed in different time domains and subsequently transformed into one common time domain.

According to an embodiment of the invention, the term PWM refers broadly to different types and variants of PWM modulation techniques, e.g. NPWM, LPWM, UPWM or e.g. pulse position modulation, i.e. wherever a pulse must be shifted according to a predefined modulation technique.

In an embodiment of the invention, the PWM-modulated output signal representation (OS) is established according to a time transformation scheme.

According to an embodiment of the invention a time transformation scheme may advantageously be applied for converting a time estimate determined in one domain into corresponding intersection estimate in another domain. The time transformation scheme may generally comprise very straightforward time transformations, e.g. by applying simple addition and subtracting by a fixed time representation value. However, more complex time transformation schemes may be applied.

In an embodiment of the invention, said time transformation scheme determines a serial stream of intersection estimates (SIR) and whereby said serial stream comprises frames of a predetermined number of PWM determining estimates.

According to an advantageous embodiment of the invention, the serial stream of intersection estimates may be regarded as frames of intersections, where the individual frames determine the combined properties a corresponding period of a intended reference signal.

In an embodiment of the invention, at least one of said predetermined number of PWM determining estimates is established on the basis of a corresponding first parallel intersection estimate being modified by a first time shift and where at least one further of said predetermined number of PWM determining estimates is established on the basis of a further corresponding parallel intersection estimate being modified by a further time shift differing from said first time shift.

In an embodiment of the invention, said first time shift is obtained by adding $\Delta T$ to said first parallel intersection estimate, said further time shift is obtained by subtracting $\Delta T$ from said further parallel intersection estimate and where said established time shifted intersection estimates result in a first PWM output signal.

In an embodiment of the invention, a further PWM output signal is obtained by establishing a first differential time shift by subtracting $\Delta T$ from said first parallel intersection estimate and establishing a further differential time shift by adding $\Delta T$ to said further parallel intersection estimate and where said established time shifted intersection estimates result in a further PWM output signal.

In an embodiment of the invention, said parallel reference signal representations (PRSR) comprise two geometrically linear functions and where said time transformation scheme is applied for subjecting intersection estimates obtained between said two linear functions and the input signal representation (IS) to two different time shifts, thereby transforming said intersection estimates into intersection estimates referring to the same time base.

In an embodiment of the invention, said parallel reference signal representations (PRSR) comprise two functions, preferably linear, and where said time transformation scheme is applied for subjecting intersection estimates obtained between said two functions and a differential input signal representation (IS) to four time shifts, at least two of said four shifts being mutually different, thereby transforming said intersection estimates into intersection estimates referring to the same time base.

In an embodiment of the invention, a three-level output signal is obtained by determining four intersections referring to different time bases and subsequently transforming these intersections into corresponding intersections referring to the same time base according to said time transformation scheme.

In an embodiment of the invention, a three-level output signal is obtained by determining two intersections between a parallel reference signal representation (PRSR) of a double-sided triangular reference signal and an input signal representation (ISR), transforming said two determined intersections into four intersection representations by four time shifts.

In an embodiment of the invention, said input signal representation comprises a single-ended input.

In an embodiment of the invention, said input signal representation comprises a differential input.

In an embodiment of the invention, said input signal (IS) is digitally represented.

In an embodiment of the invention, said stream of parallel reference signal representations (PRSR) is established as functions having desired properties with respect to the time axis.

In an embodiment of the invention, said stream of parallel reference signal representations (PRSR) is established on the basis of a model function (MF), which is represented in at least two different domains having mutually different time bases, one part of the model function (MF) being represented in a first domain and at least one further part being represented in a further domain.

In an embodiment of the invention, said model function (MF) is a double-sided triangular periodic signal.

FIGURES

The invention will now be described with reference to the figures of which

FIG. 1 illustrates the principles of an advantageous embodiment of the invention, FIG. 2 illustrates the principles of a parallel and serial domain according to an embodiment of the invention, FIG. 3 illustrates the principle of double-sided PWM modulation, FIG. 4 illustrates a model signal of a desired effective reference signal, FIG. 5 illustrates the principle of determining intersections in one domain and transforming the obtained result into another domain, FIG. 6 illustrates an application of the invention, FIGS. 7 and 8 illustrate the obtained result of a double-sided PWM according to an embodiment of the invention, FIG. 9 illustrates the principles of three-level differential PWM according to a preferred embodiment of the invention, FIGS. 10 and 11 illustrate the obtained result of a three-level double-sided PWM according to a preferred embodiment of the invention, FIGS. 12-14 illustrate various embodiments of the invention, FIGS. 15 and 16 pinpoint the single transformation steps according to a preferred embodiment of the invention, FIG. 17 illustrates an applicable counter-based PWM pulse generator and FIG. 18 illustrates a differential implementation of the invention.

DETAILED DESCRIPTION

Basically, the invention may be applied in different technical contexts, as it will be described below.

A typical application may be a PWM amplifier or converter (PWM: Pulse width modulation), where the input signal is compared to a reference signal, physically or digitally represented, and where the comparisons result in a stream of pulse width modulated output signals. This application, in itself known within the art, may therefore be subject to several modifications with respect to e.g. handling of input signals, establishment of intersections between input and reference signal(s) and in particular with respect to the output stage where output edges are created on the basis of the final determined edges. This stage may be subjected to several different noise shaping techniques in order to for example compensate the relatively restricted possibilities of obtaining high-quality signals by available high or small signal electronics.

FIG. 1 illustrates the principles of an advantageous embodiment of the invention.

Starting from the left, an input signal IS is fed to the intersection determining block 10 of a signal processing circuit according to an embodiment of the invention. The intersection-determining block 10 also receives a reference signal representation PRSR referred to in the following as a parallel signal representation. This will be described in detail below with reference to FIG. 2. It should, however, be noted that the illustrated block diagram should not be confused with the physical topology of a physical circuit according to the principles of the invention. As an example, the illustrated reference signal representation PRSR may typically be established internally in the intersection block 10. In other words, according to an embodiment of the invention several modifications may be applied with respect to the current and other illustrations as long as the basic ideas of the invention are complied with.

The input signal is compared to two or more separate reference signal representations forming the complete reference signal representation PRSR and results in a corresponding number of parallel intersection estimate representations PIR. Although referred to as parallel, it should be emphasized that the way of representing the intersection estimate representations may vary from application to application, e.g. as a serial stream of intersection estimates. The term parallel in this context basically serves to highlight the origin of the determined intersection estimates, namely the basic parallel separation of two or more comparisons.

Moreover, it should be emphasized that the phrasing of parallel signal or representations does not necessarily refer to processes or streams, which are strictly processed at the same time. This may of course happen according to variants of the invention, but the expression parallel rather covers separate handling and processing of the representations.

The parallelly processed intersection estimates will then be fed to a domain-transforming block 11. The domain-transforming block 11 transforms incoming parallel intersection estimates PIP into intersection estimates referring to a common time base, i.e. a serial stream of intersection estimates SIR.

Again, the term serial stream should not be confused with requirements of keeping the intersection information in one single stream, but rather that the intersection estimates now refer to a common time base and may therefore directly or in a modified way be converted or result in the establishment of a PWM output signal. Hence, the serial stream of intersection estimates SIR may in fact be kept in one or several signal processing formats.

It should in this context be noted that different necessary processing, such as noise shaping, may also be included in the domain-transforming block 11.

The function of the time domain-transforming block 11 is primarily to bring the established intersection estimates PIR into one or multidimensional serial stream SIR of intersection estimates referring to the same time base. This may be done in several different ways according to a time transformation scheme by establishing a relative alignment in time between the parallel streams of intersection estimates PIR. The relative alignment in time may e.g. be established by a time shift, positive or negative to one or more predetermined strings of the parallel intersection estimates, thereby establishing an effective relative alignment in time between the previously established intersection estimates. This relative alignment has the effect of transforming the parallelly determined intersection estimates into a common time base, which may subsequently be more or less straightforwardly converted into a PWM output.

The above-mentioned time shift may be fixed or may on a real-time basis be established according to a predefined time shift determining function.

The serial intersection estimates SIR are then fed to a converter 12, which may then convert the intersection estimates into serial output signals OS, i.e. a single or multistream signals referring to the same time base.

It is noted from the above that a transformation from one domain into another of the intersection estimates may simply be performed by a fixed or varied adding or subtraction of time. According to a very preferred embodiment of the invention, this transformation may simply be performed by adding or subtracting of fixed time shift, namely time shift corresponding, with opposite sign, to the delays applied for transforming a model reference signal into the parallel reference signal representation PRSR.

Basically, a parallel reference signal representation PRSR represents a signal, which may be somewhat more complex in nature compared to e.g. traditional sawtooth reference signals of PWM amplifiers. The parallel representation may comprise two or more partial reference signal components, together representing a complete reference signal property of a desired reference signal model.

According to an embodiment of the invention, the different partial components of the reference signal representation, representing the desired reference properties may be individually prepared for the intended computing. An example of a preferred preparation of a partial signal is an individual transformation of the time axis of the different partial model components for the purpose of representing the partial representations of the model in a manner suitable for the intended computing, e.g. by transformation of the time axis so that one or preferably all the partial reference signal components are symmetrical with respect to time t=0. In this context t=0 refers to the centre of a PWM period of a partial reference signal.

It should again here be emphasized that the term parallel refers to a number of partial reference signal representations referring to at least two different time bases, and not to the specific format in which the reference signal representation has been represented in but rather to the nature of the partial signal representations. Evidently, a parallel format or e.g. a time-multiplexed format, i.e. both in parallel or serial streams of signal representing data, may be applied for the purpose within the scope of the invention. This aspect is relevant for all references to parallel or serial computing or data streams.

FIG. 2 illustrates by means of a block diagram a model function MF representing an example of a desired reference signal function, e.g. a triangular double-sided reference signal. The illustrated model function MF may then be divided into a suitable number of partial model functions, also referred to as parallel reference signal representations, representing the characteristics of the desired reference function. This may in practice and preferably be done via an individual time-transformation TT of the intended partial reference signal representations. In case of a double-sided signal, a suitable number of parallel reference signal representations PRSR may be two, e.g. PRSR1 and PRSR2. The time transformation TT1 may advantageously be applied for the purpose of obtaining a signal representation of the individual parallel reference signal representations PRSR1, PRSR2, PRSR3 and PRSRN, which may advantageously be computed for the desired purpose and the applied time transformation applied is therefore typically different with respect to at least two partial reference signal representations.

It is noted that the above-described establishment of a parallel reference signal representation PRSR1, PRSR2, PRSR3 and PRSRN basically represents one of several methods applicable for the purpose of establishing a desired reference signal representation. Once the parallel reference signal representations PRSR1, PRSR2, PRSR3 and PRSRN have been established, no further considerations regarding the origin of these signals need to be done other than adapting a suitable time transformation TT2 for the purpose of converting the established intersection estimates IE1, IE2, IE3 and IEN into an output signal referring to the same time base.

It should be noted that the establishment and handling of intersection estimates and the subsequent conversion of these into a signal referring to the same time base may be done in numerous different ways. Thus, a variation with respect to the above-described topology may be used when establishing a differential PWM output signal e.g. with reference to FIG. 15 and FIG. 16.

Different detailed examples of such embodiments of the invention will be described below.

According to an embodiment of the invention, the reference signal representation may for example be obtained by applying a more complicated reference waveform, e.g. a triangular shape instead of a conventional sawtooth, thereby obtaining improvement of the quality of a PWM signal. This shape causes the PWM pulse to have both a start point (which in the sawtooth case is fixed in time) and an end point.

Such a waveform is illustrated in FIG. 3 where an input signal representation ISR is compared with a triangular reference signal RS.

In order to obtain an advantageous handling and computing of the above-illustrated in the context relatively complex reference signal representation, the x-axis, i.e. the time axis, may be shifted and scaled before the process of determining intersection estimates between the input signal representation and the reference signal representation begins. The reference signal may be set to equal f(x)=x in FIG. 4 illustrating a stream of periodic reference signal representations.

The left side of the triangle may be regarded as a first part of the reference signal representation and the right side of the triangle may be regarded as a second part of the reference signal.

A second order model of the input signal representation may be established by means of a polynomial model and may be found as:

$$\begin{vmatrix} p_0 \\ p_1 \\ p_2 \end{vmatrix} = \begin{vmatrix} t(k-1)^0 & t(k-1)^1 & t(k-1)^2 \\ t(k)^0 & t(k)^1 & t(k)^2 \\ t(k+1)^0 & t(k+1)^1 & t(k+1)^2 \end{vmatrix}^{-1} \cdot \begin{vmatrix} x(k-1) \\ x(k) \\ x(k+1) \end{vmatrix}$$

It should be noted that several other types of input signal representations may be applied within the scope of the invention, e.g. first, third or higher order polynomials. For the purpose of illustrating some important features and benefits obtained according to an embodiment of the invention, the further explaining is based on a second-order representation a double-sided, i.e. a triangular, reference signal represented according to an embodiment of the invention as a parallel reference signal.

So the polynomial model using the left slope x-axis, i.e. the first partial reference signal representation, equals:

$$\begin{vmatrix} p_0 \\ p_1 \\ p_2 \end{vmatrix} = \begin{vmatrix} (-3)^0 & (-3)^1 & (-3)^2 \\ (1)^0 & (1)^1 & (1)^2 \\ (5)^0 & (5)^1 & (5)^2 \end{vmatrix}^{-1} \cdot \begin{vmatrix} x(k-1) \\ x(k) \\ x(k+1) \end{vmatrix} =$$

$$\begin{vmatrix} 5/32 & 15/16 & -3/32 \\ -3/32 & 1/8 & 1/16 \\ 1/32 & -1/16 & 1/32 \end{vmatrix} \cdot \begin{vmatrix} x(k-1) \\ x(k) \\ x(k+1) \end{vmatrix}$$

And for the right slope, i.e. the second partial reference signal representation:

$$\begin{vmatrix} p_0 \\ p_1 \\ p_2 \end{vmatrix} = \begin{vmatrix} (-5)^0 & (-5)^1 & (-5)^2 \\ (-1)^0 & (-1)^1 & (-1)^2 \\ (3)^0 & (3)^1 & (3)^2 \end{vmatrix}^{-1} \cdot \begin{vmatrix} x(k-1) \\ x(k) \\ x(k+1) \end{vmatrix} =$$

$$\begin{vmatrix} -3/32 & 15/16 & 5/32 \\ -1/16 & -1/8 & 3/32 \\ 1/32 & -1/16 & 1/32 \end{vmatrix} \cdot \begin{vmatrix} x(k-1) \\ x(k) \\ x(k+1) \end{vmatrix}$$

As seen in the above, the two transformation matrices are relatively complicated to compute.

And furthermore, the two polynomial models are now asymmetrically located in time in relation to the PCM samples t(k−1), t(k) and t(k+1) on which the model is based. This fact introduces a DC error, which rises with the frequency of the input signal A way to get rid of the problems of the asymmetrical approach is to shift the left slope of the triangle to the right, and to shift the right slope of the triangle to the left, thus creating an X, followed by a correction on the crosspoint computed, as shown in FIG. 5, also referred to as the X-modulation. With reference to the terms introduced with reference to FIG. 1 and FIG. 2, the two partial reference signals may individually be transformed by means of two different time shifts in order to establish two parallel reference signal representations, PRSR1 and PRSR2, basically referring to two different time bases. These two parallel reference signal representations, PRSR1 and PRSR2, may be computed independently for the purpose of determining the intersection estimates, IE1 and E2, between the two parallel reference signal representations, PRSR1 and PRSR2, and the input signal representation ISR. Any suitable intersection providing technique may be applied within the scope of the invention. A preferred intersection technique is described in the pending patent application PCT/DK03/00334.

The intersection estimates IE1 and IE2 may then be transformed according to a time transforming scheme into transformed intersection estimates, TIE1 and TIE2, referring to a common time base. According to an advantageous embodiment of the invention the applied time transformations may simply by applied time shifts of opposite signs of the time shifts applied for bringing the desired reference signal into the two parallel reference signal representations PRSR1 and PRSR2.

Another way of interpreting FIG. 5 is that 1.0 is added to the signal in the PCM domain, and 1.0 is subtracted in the PWM domain.

To make the slopes in the X equal f(x)=x, the only thing needed is to multiply the x-axis with 2. The transformation matrix for the X-modulation is:

$$\begin{vmatrix} p_0 \\ p_1 \\ p_2 \end{vmatrix} = \begin{vmatrix} (-4)^0 & (-4)^1 & (-4)^2 \\ (0)^0 & (0)^1 & (0)^2 \\ (4)^0 & (4)^1 & (4)^2 \end{vmatrix}^{-1} \cdot \begin{vmatrix} x(k-1) \\ x(k) \\ x(k+1) \end{vmatrix} =$$

$$\begin{vmatrix} 0 & 1 & 0 \\ -1/8 & 0 & 1/8 \\ 1/32 & -1/16 & 1/32 \end{vmatrix} \cdot \begin{vmatrix} x(k-1) \\ x(k) \\ x(k+1) \end{vmatrix}$$

It is noted that the relatively simple illustrated transformation of one of the two parallel signal representations results in a matrix which now comprises a number of zeros; in this example row one, column one and three and row two, column two.

In this way, the basic necessary computing on the reference signal(s) may be simplified for the purpose of root solving/finding of intersections between the reference signal and the input signal.

The switch points may in principle now be found according to known principles already applied in e.g. LPWM, e.g. by applying different more or less complicated models of the input signal, e.g. first or higher order polynomials.

When the switch points based on the simplified parallel reference signals, here: two partial reference signals computed in two different individual time domains, are determined, they may be transformed into a common time domain for the purpose of realizing a PWM signal referring to the same time base.

According to a preferred embodiment of the invention, the desired switch points may be found simply by modifying the individual switch times by a time transformation equalling the applied time transformation applied when establishing the parallel reference signal representation with an opposite sign.

In other words, if the first of two parallel reference signals is established on the basis of a time transformation of +½ and the second is established on the basis of a time transformation of −½ with respect to the intended reference signal, e.g. a triangular reference signal, the two resulting switch points may be transformed into a common time base simply by subtracting ½ from the first parallel reference signal and adding ½ to the second.

Other more complex and advanced methods of a transforming into a common time domain may be applied.

It should in this context be noted that, according a the teaching of the invention, several apparently rough approximations may actually lead to impressing performance when the method is applied in connection with PWM modulation.

In a typical application, different linearization techniques may compensate more or less for the relatively restricted resolution in time. Different intersection techniques may be applied within the scope of the invention. Subsequently, the modulation technique according to the present invention teaches that an intersection determined in one domain may actually be transformed more or less directly into another time domain, still with more than acceptable errors. According to an embodiment of the invention, the disclosed technique may even result in reduced distortion when compared with conventional PWM techniques with fewer computations.

FIG. 6 illustrates an example of an application of the present invention. The illustrated system comprises a PWM amplifier/audio system.

The system comprises an input block 1901 adapted for receipt of a coded audio signal. The input block 1901 branches the input signal into two principle different directions; in one direction for the purpose of converting the information coded in the input signal into a relevant PWM representation and one direction for the purpose of establishing a clock reference signal on the basis of the input signal.

The latter direction is represented by a PLL clock-synchronizing block 1902 referring to a high-frequency oscillator block 1903.

The first principle direction starts with the upsampling block 1904 basically transforming the input signal from one sampling frequency representation into an N times higher sampling representation.

The upsampled signal is then fed to an intersection-computing block 1905 adapted for determination of intersections with a parallel reference signal representation according to an embodiment of the invention. The consecutive noise shaping and quantizing block 1906 feeds the established intersections to a time alignment block 1907 according to an embodiment of the invention, where the established intersections are transformed into one common time domain, elsewhere in the application referred to as a serial signal. The transformed signal is then fed to a PWM pulse generator, in this case a true differential three level generator 1908 referring to the high frequency generator 1903.

The resulting PWM signal is then fed to a power stage 1909 and from there via a demodulator 1910 to a loudspeaker 1911.

Evidently, the above-mentioned application only describes one of several applications within the scope of the invention. Examples of straightforward variants according to an embodiment of the invention may e.g. be realized by replacing the above-illustrated blocks 1905, 1906 and 1907, corresponding to 14, by the blocks described and illustrated in the blocks illustrated in FIG. 12 and FIG. 13.

FIGS. 7 and 8 illustrate a comparison between ideal triangle modulation and X-modulation using the sparse polynomial model.

It is noted that FIG. 8 illustrating the above-described method, when compared with an ideal triangle modulation, although advantageous in many aspects, features undesired harmonics.

In the following a further embodiment of the invention will be described featuring further advantageous properties. The further embodiment of the invention comprises a three-level PWM modulator, also referred to by some as a true differential PWM.

Establishment of a three-level PWM signal may e.g. be obtained by changing the sign on the input signal or by changing the sign on the reference signal. A nice property of the above-mentioned X-reference signal is that it is symmetrical in both x and y dimension. So actually, implicitly in the original calculation of the intersection between the input and the "original X", the two further intersections needed have already in practice been established. All we have to do is to time shift these intersections.

The above-mentioned shifting is illustrated in FIG. 9. It is noted that in practice the three-level PWM signal is obtained more or less "free of charge" simply by applying an opposite time shift in the sense that the more requiring computing is performed when establishing the intersections.

Figure 12:
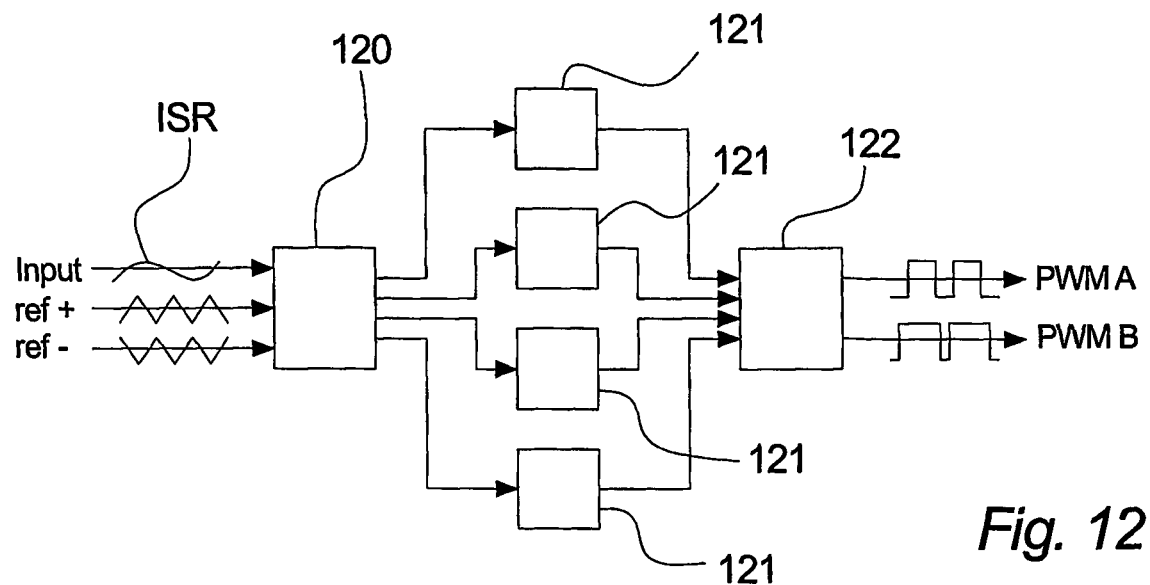
FIGS. 12 to 14 illustrate a further feature of the invention where noise shaping is included in the realization of the PWM circuit.

FIG. 12 illustrates a prior art three-level PWM circuit in which an input signal is compared to two opposite sign reference signals. Four intersections are determined in each period of the reference signal by an intersection computer 120. Each of the established intersections are individually noise shaped by quantizer and noise shaper circuits 121, subsequently feeding a PWM pulse generator 122 outputting a differential PWM output, also referred to as a three-level PWM output.

Figure 13:
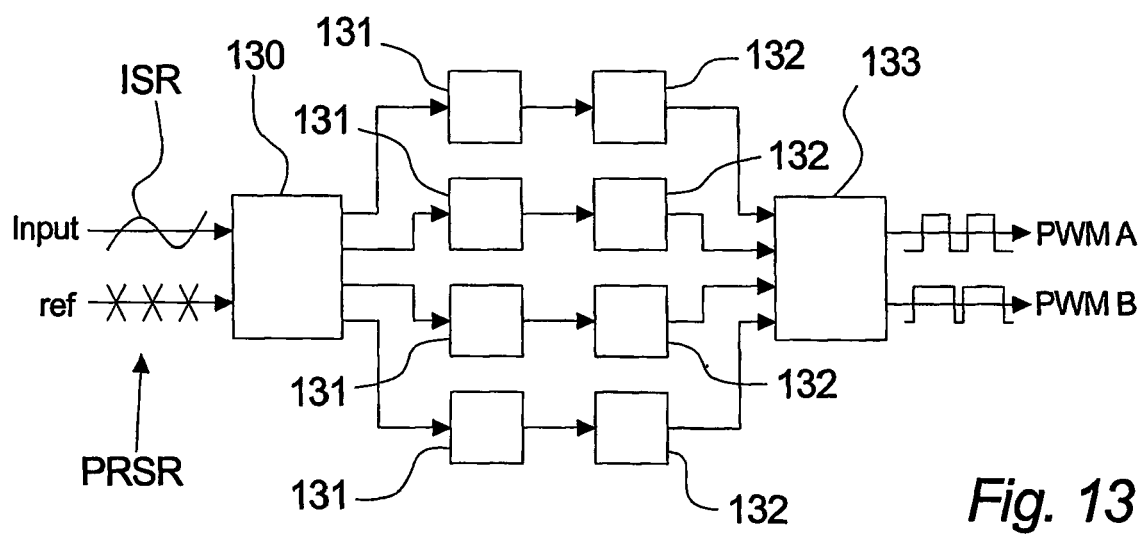

FIG. 13 illustrates an embodiment of the invention where an input signal is compared to two opposite sign reference signals represented as a parallel reference signal representation according to an embodiment of the invention. Four intersections are determined in each period of the reference signal by an intersection computer 130. Each of the established intersections are individually noise shaped by quantizer and noise shaper circuits 121 and thereafter shifted in time to the same time domain and finally fed to a PWM pulse generator outputting a differential PWM output, also referred to as a three-level PWM output.

Figure 14:
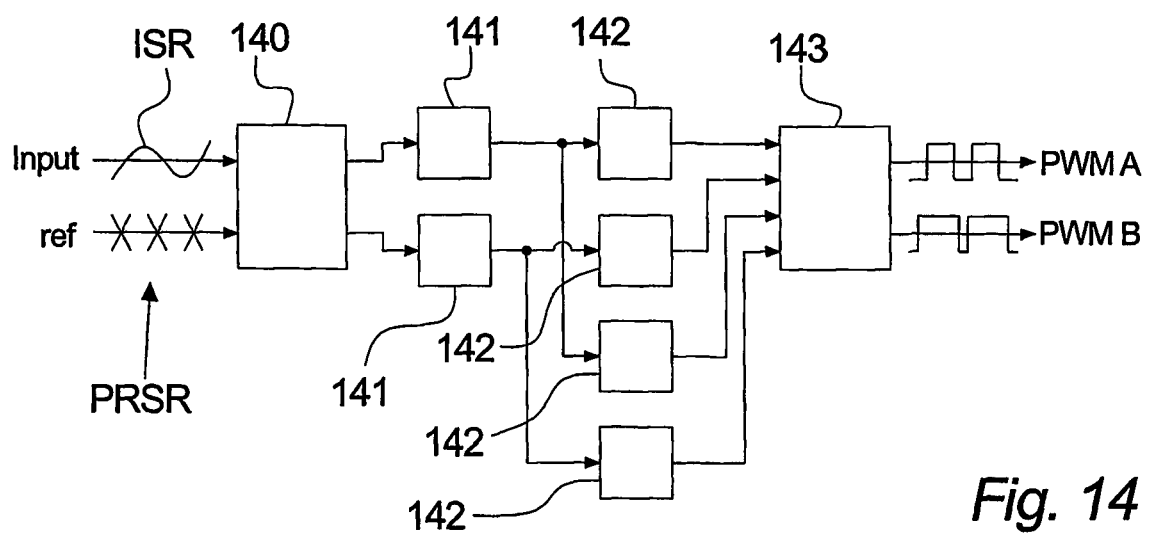

FIG. 14 illustrates a further and preferred embodiment of the invention where an input signal is compared to two opposite sign reference signals represented as a parallel reference signal representation according to an embodiment of the invention. Two intersections are determined in each period of the reference signal by an intersection computer 140. Each of the two established intersections are individually noise shaped by quantizer and noise shaper circuits 141 and thereafter shifted in time to the same time domain and finally fed to a PWM pulse generator outputting a differential PWM output, also referred to as a three-level PWM output. According to this embodiment, corresponding to the embodiment illustrated according to FIGS. 8 and 9, the noise shaping is performed only two times per every fourth determined intersection estimate. This advantage reduces the computational costs significantly.

Figure 8:
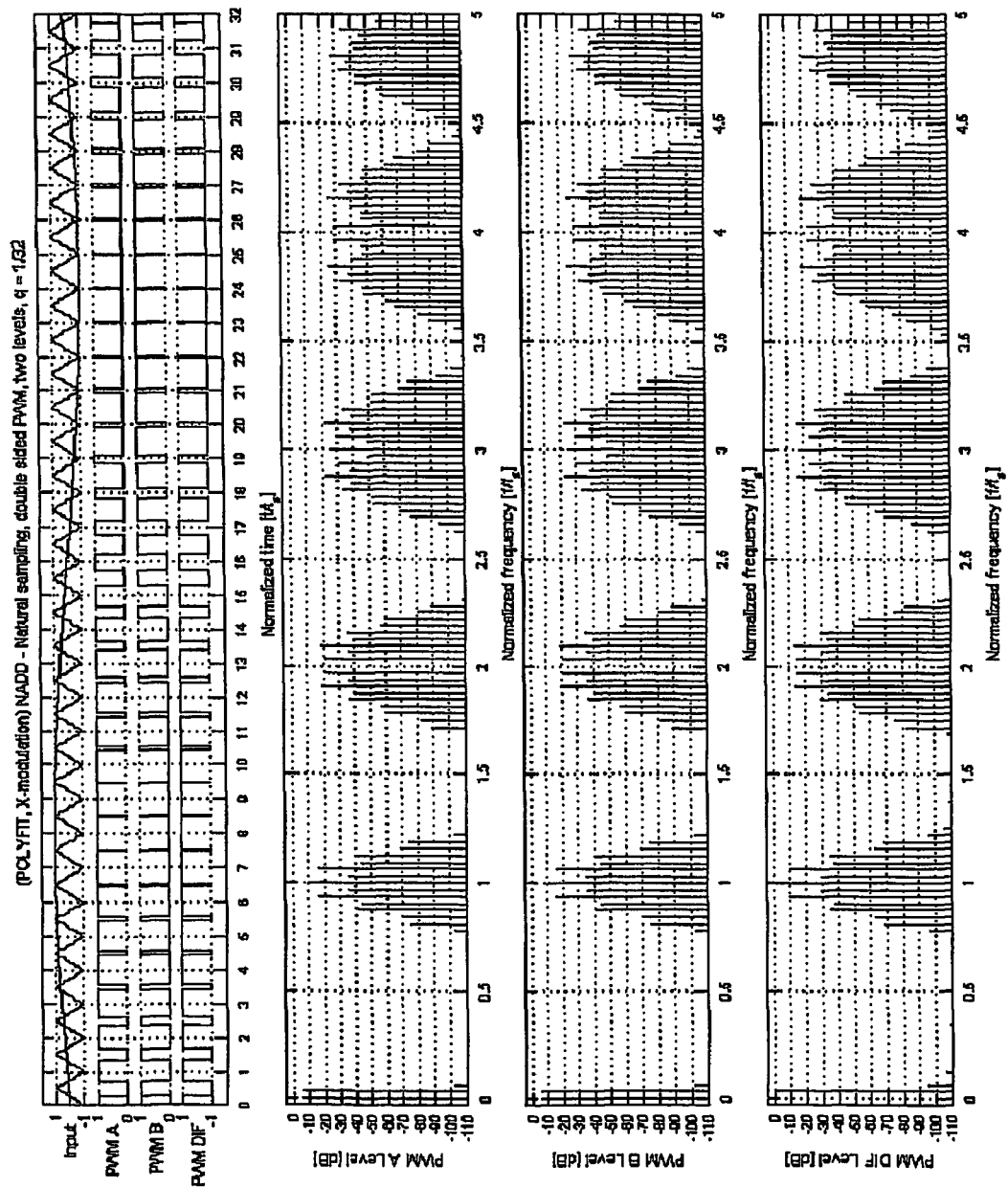
Figure 9:
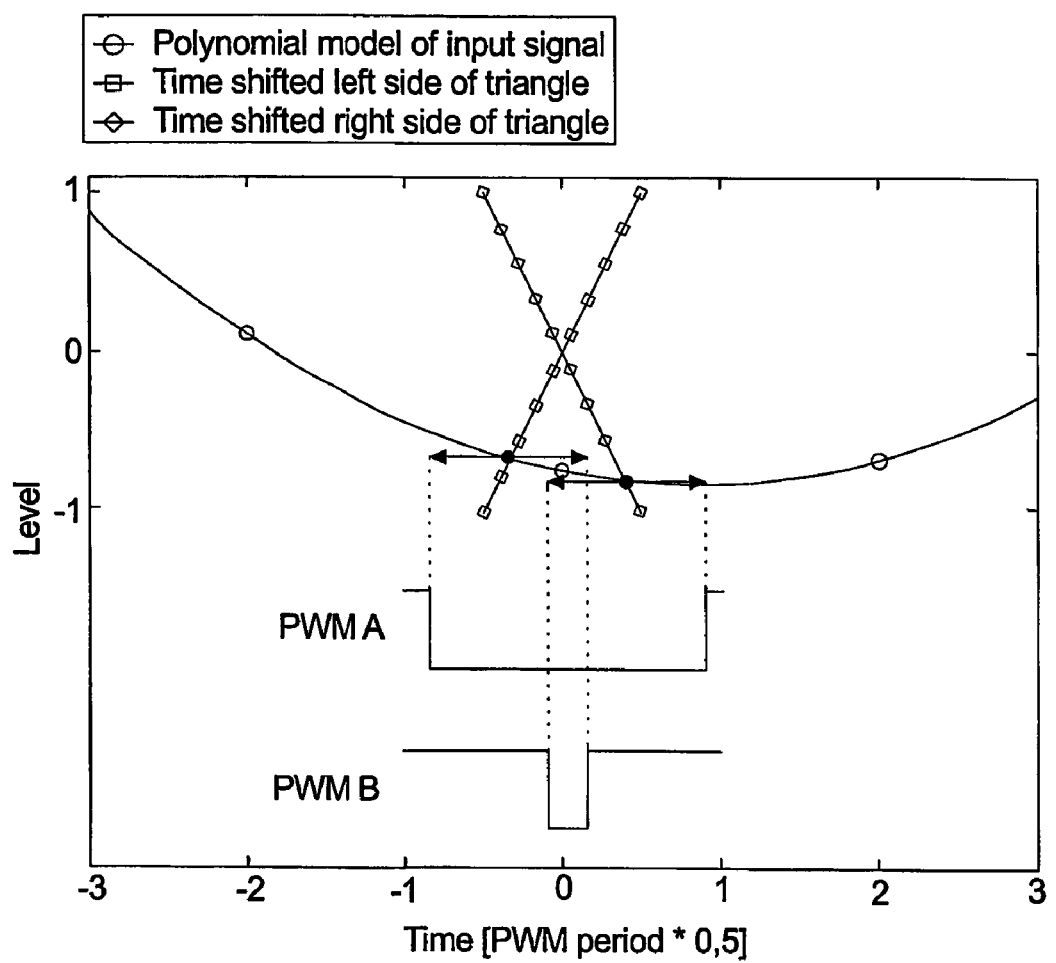
Figure 10:
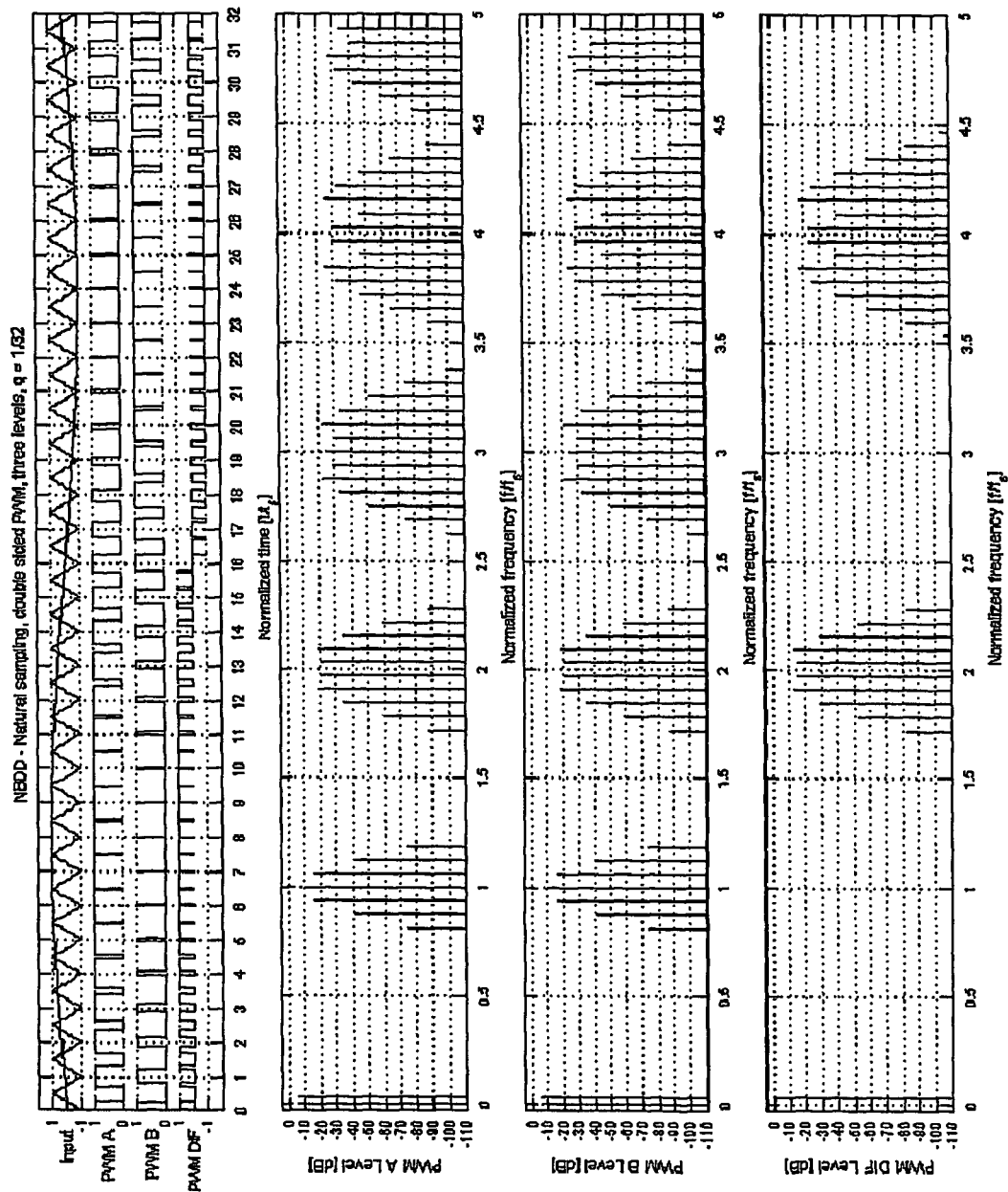
FIG. 10 and FIG. 11 illustrate a comparison between ideal three-level triangle modulation and three-level X-modulation using the sparse polynomial model. It is here noted that the three-level triangle modulation referred to in FIG. 11, even when compared with the ideal three-level triangle modulation, exhibits very low distortion and low high-frequency switch energy.
Figure 11:
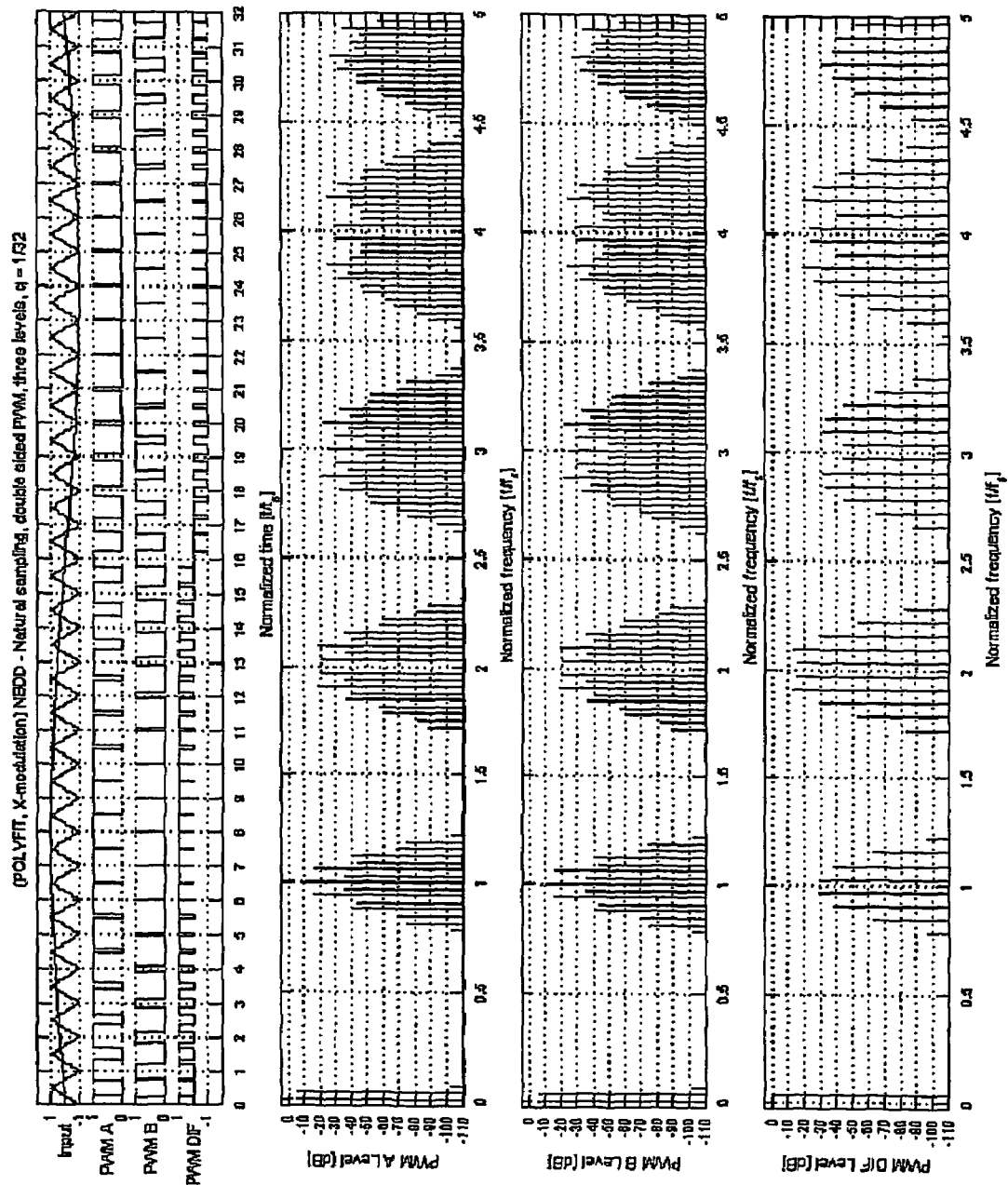
Figure 15:
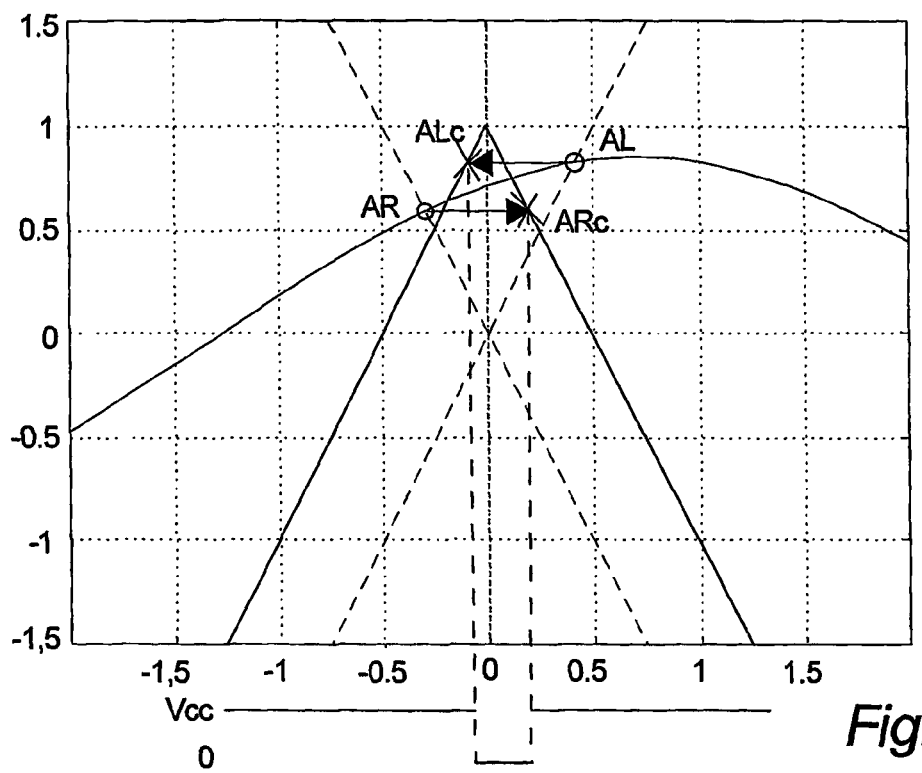

FIG. 15 illustrates the properties of the advantageous three-level differential PWM amplifier according to an embodiment of the invention corresponding to that of FIG. 8 and FIG. 9 or FIG. 14 where, basically, two determined intersection estimates are converted into four intersection estimates with very little computing, e.g. simple time shifts.

It is here noted that this feature moreover results in a simplified noise shaping due to the fact that two found intersections may be noise shaped prior to the transformation into a common time base having four intersections.

Figure 15A:
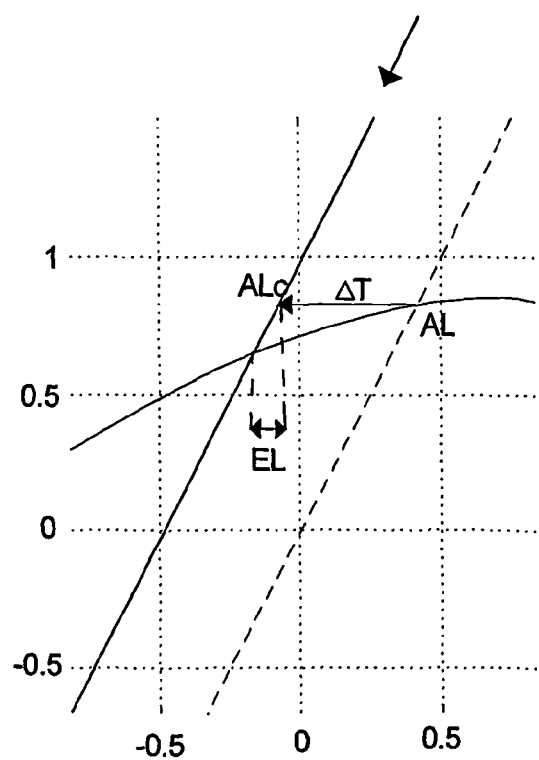
Figure 15B:
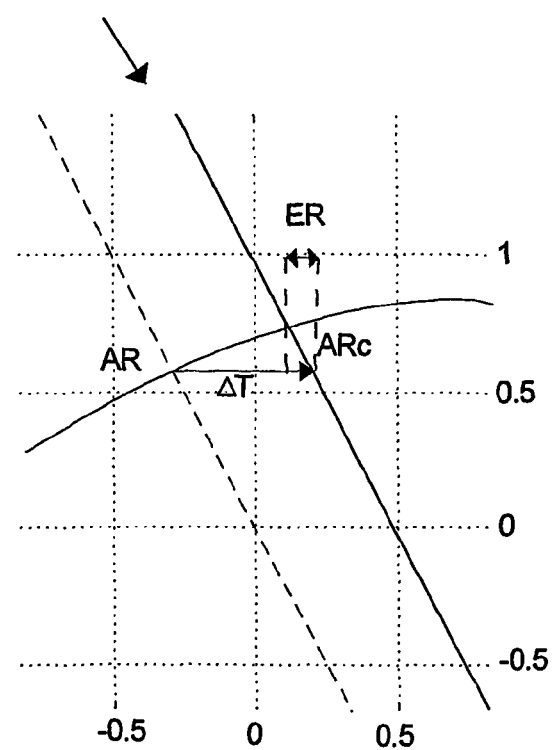

The solid line represents the intended reference signal and the broken lines represent the two parallel reference signals representing the applied parallel reference signals, each illustrated in FIGS. 15a and 15b, respectively.

According to the illustrated embodiment, a found intersection, marked by an "o" AL and AR may be transformed into an intersection marked by an "x" in a common time domain by subtracting ΔT from the found intersection AL thereby obtaining the desired intersection Alc and adding ΔT to a found intersection AR marked by an "o" in the parallel domain into an intersection ARc in the common domain marked by an "x".

For illustrative purposes the resulting errors when transforming the intersection from the parallel domain to a common domain are illustrated as EL and ER, EL representing the resulting error between the left part of the triangle reference signal ER and the input signal and between the right part of the triangle reference signal and the input signal.

Moreover, FIG. 15 illustrates an example of a resulting PWM+output signal, when modulating the input signal between a Vcc voltage and zero.

Figure 1:
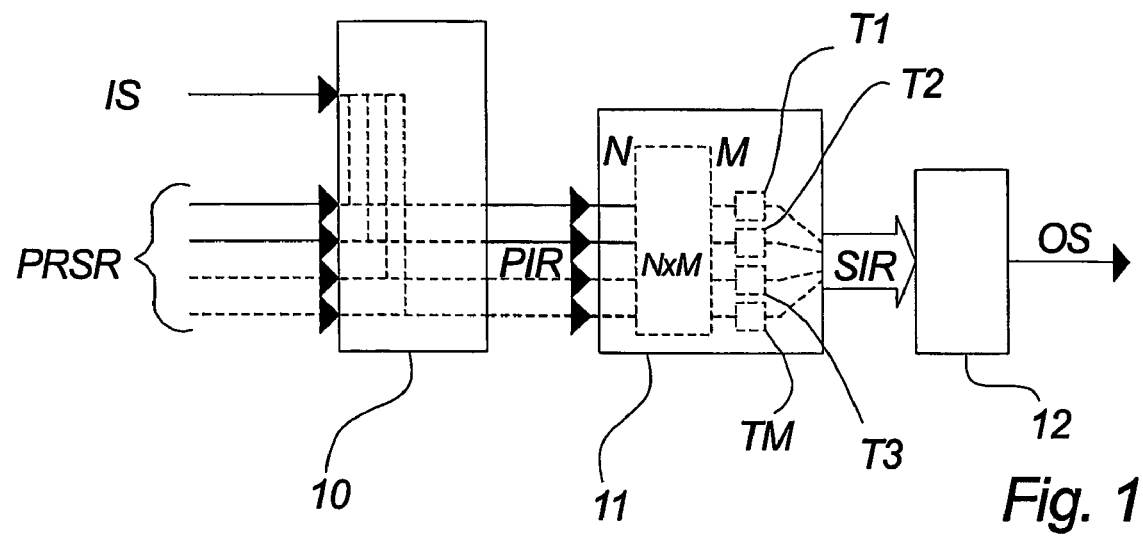
Figure 2:
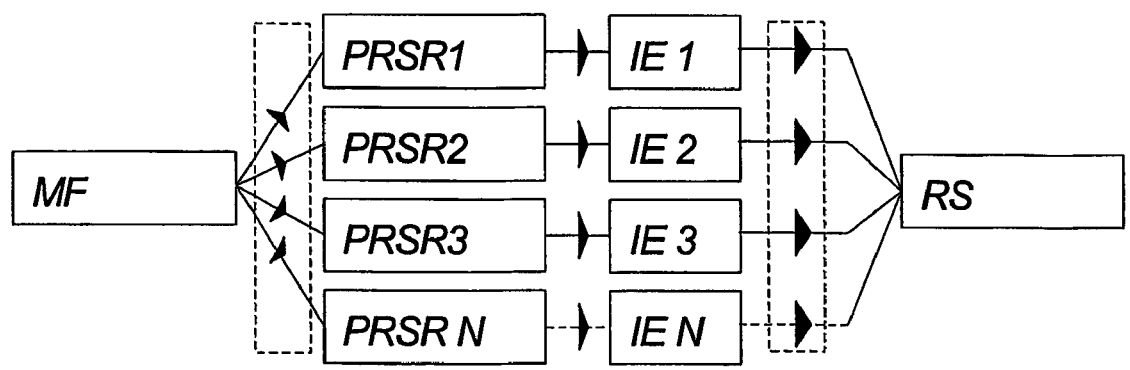
Figure 3:
Figure 3:
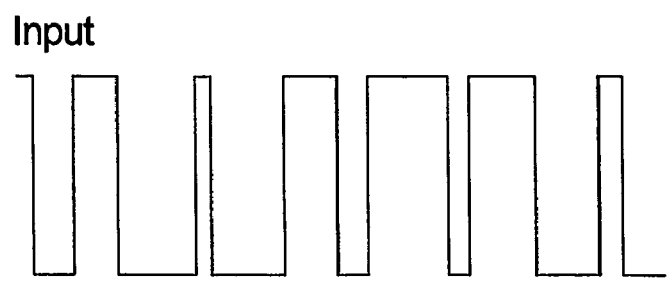
Figure 4:
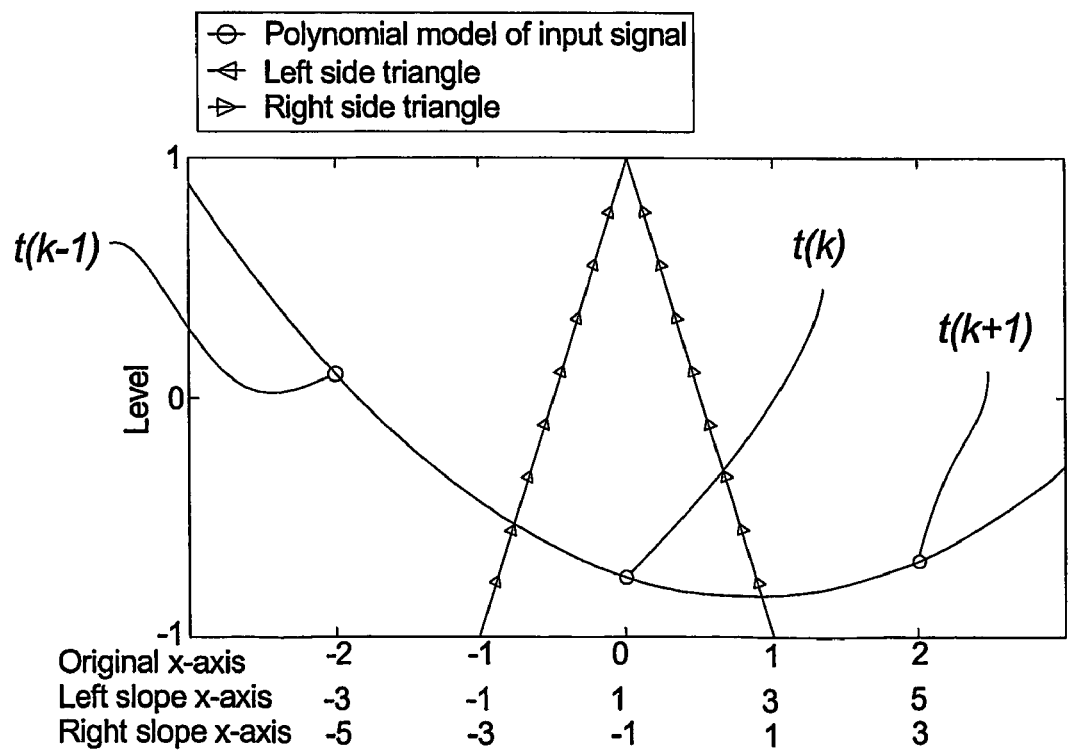
Figure 5:
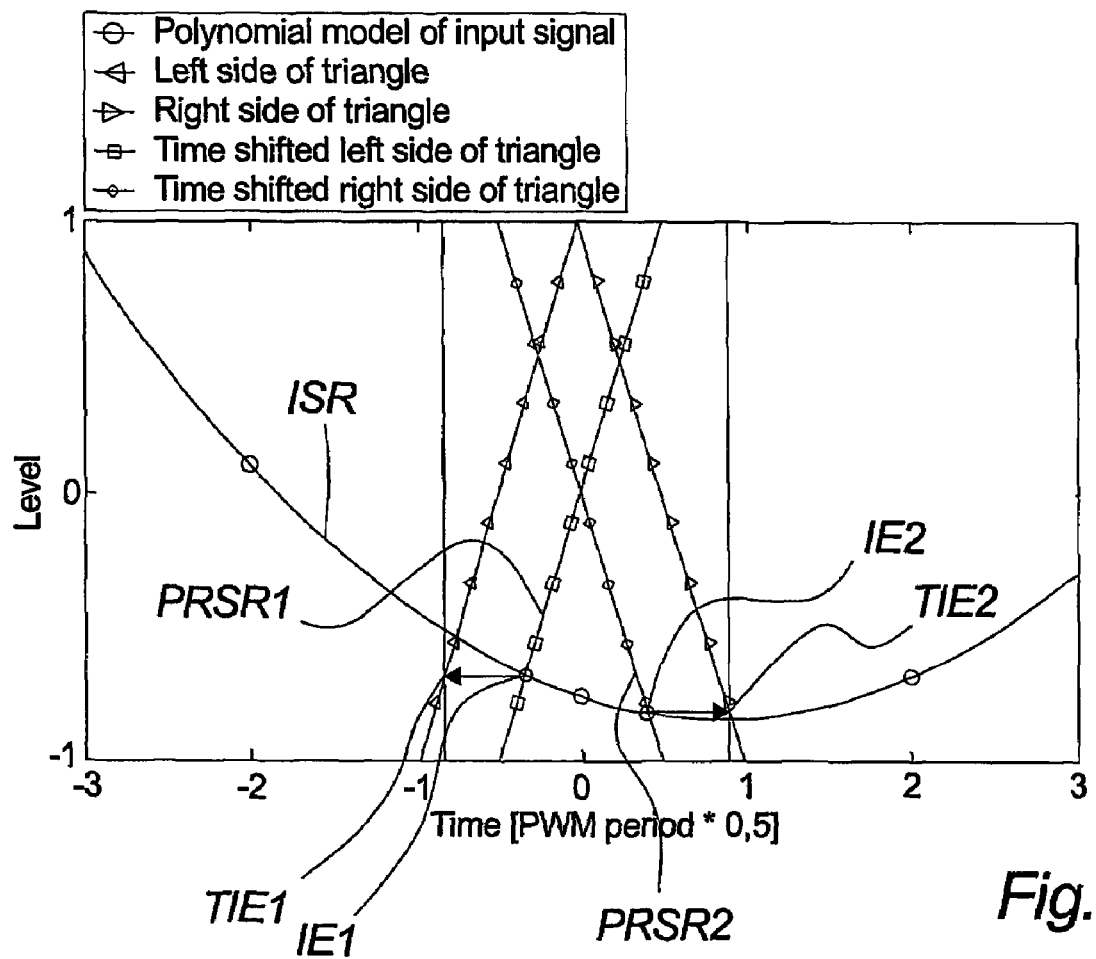
Figure 6:
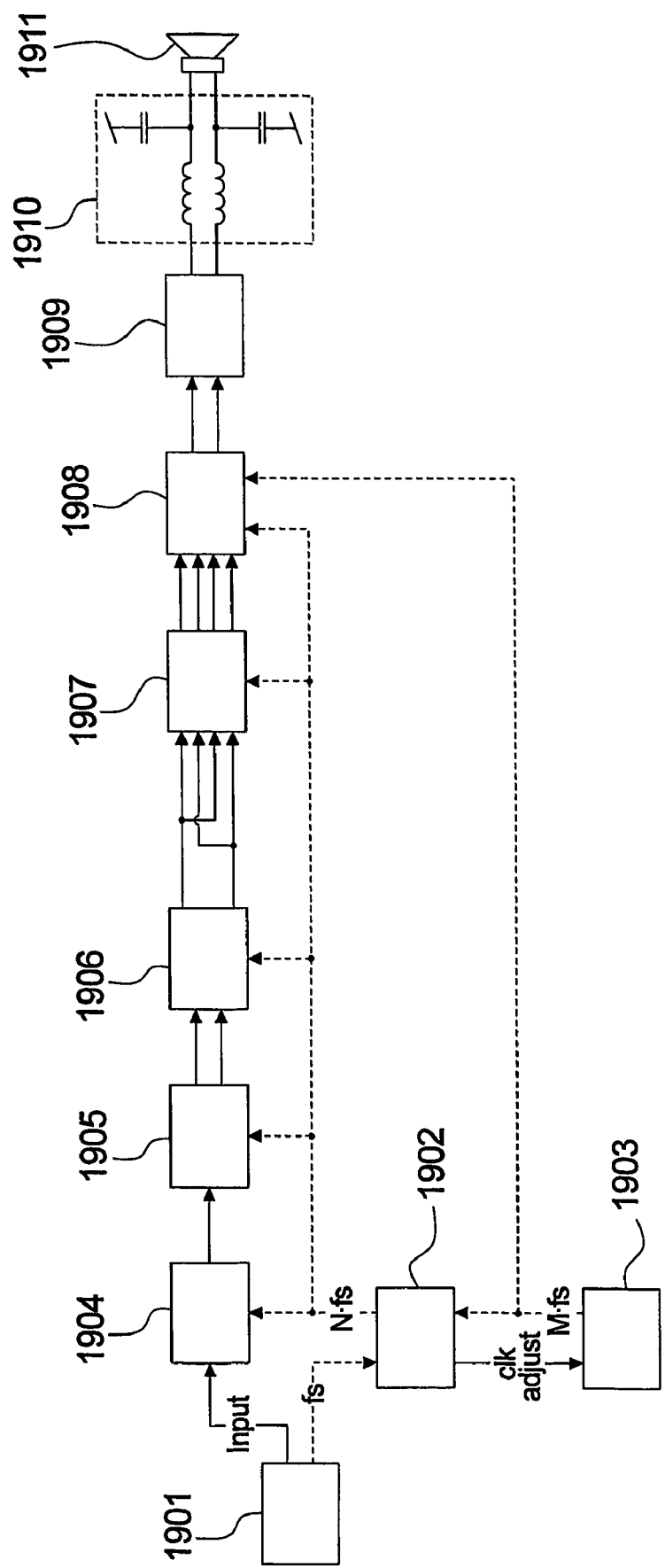
Figure 7:
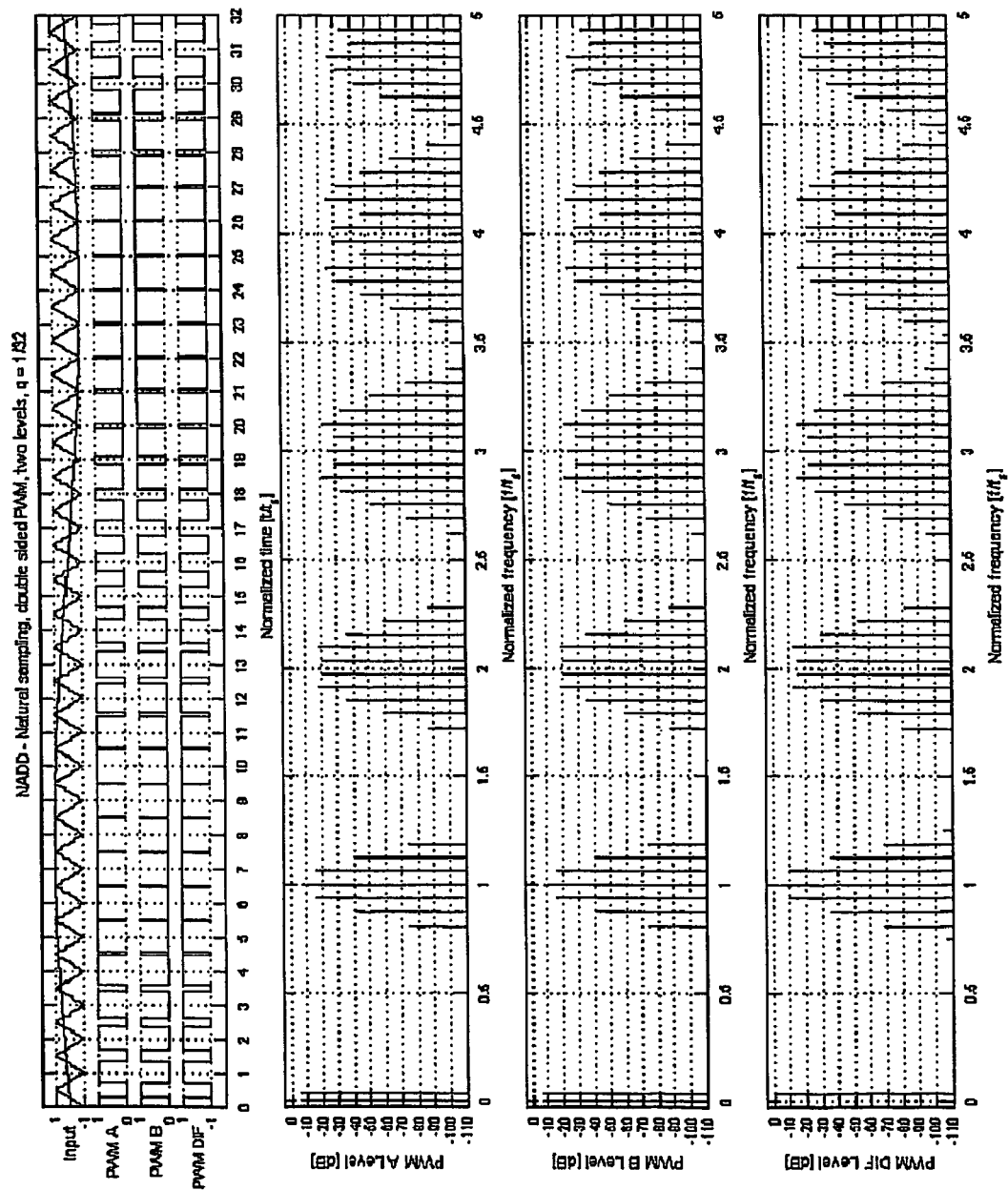

Basically, this transformation corresponds to the already described transformation explained with reference to FIG. 4 and FIG. 5.

Figure 16B:
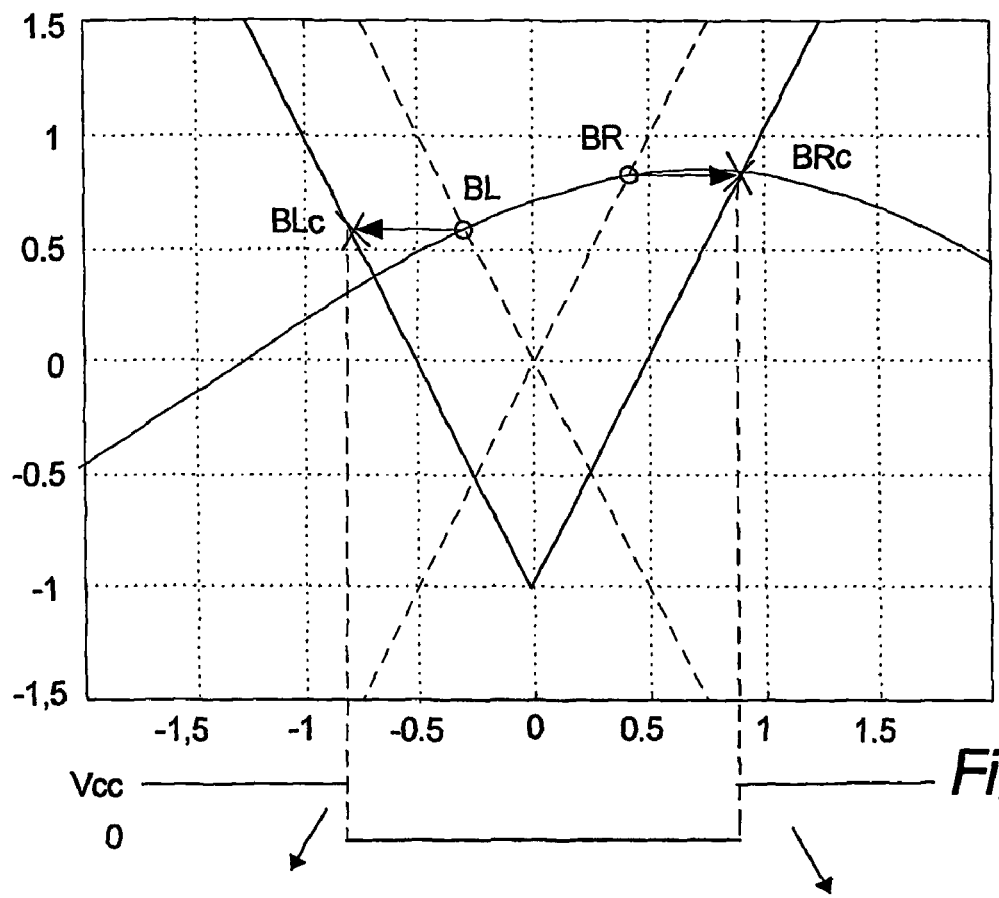
Figure 16A:
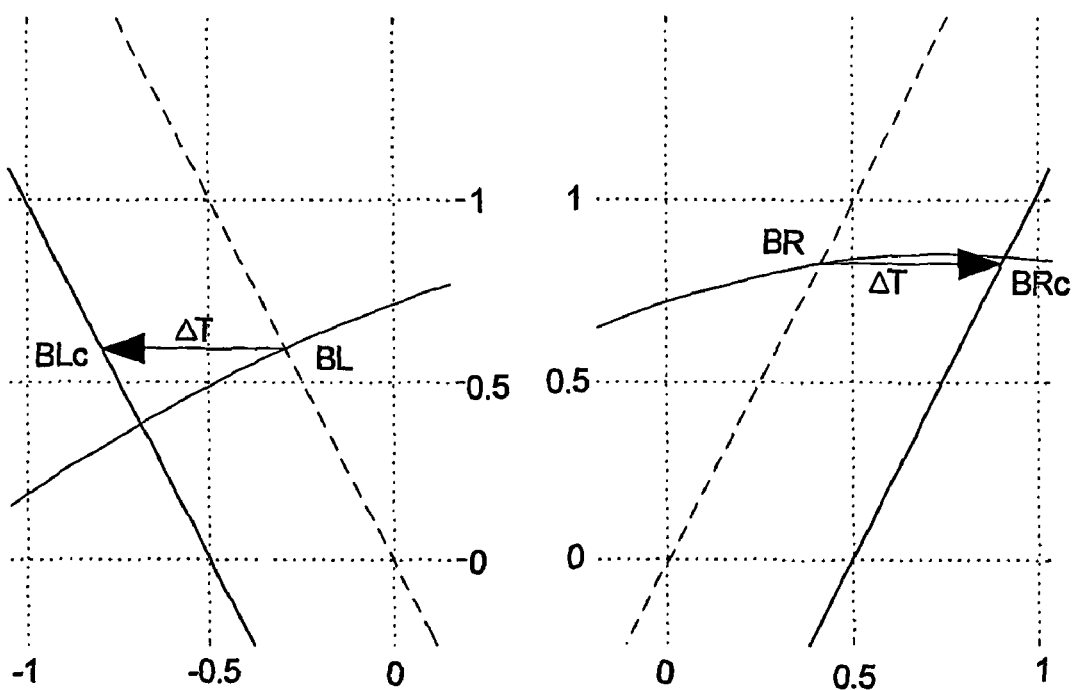

In FIG. 16, FIG. 16a and FIG. 16b, the already and above-described found intersections marked by an "o" applied for establishing a resulting PWM output signal. In this context a PWM+ and PWM− output refer to two output signals together forming a differential PWM output signal.

The highlighted intended reference signal is now the mirrored intended reference signal of FIG. 15. It is noted that this mirroring of the reference signal while maintaining the input signal basically corresponds to a mirroring of the input signal while maintaining the reference signal.

As illustrated by FIG. 16, the differential intersection values may now simply be established by transforming the found intersection BR, corresponding to the already established intersection AL, into an intersection marked by an "x" in a common time domain now by adding ΔT to the found intersection BR thereby obtaining the desired intersection BRc and now subtracting ΔT from found intersection BL marked by an "o",—corresponding to the already found AR—, in the parallel domain into an intersection BLc in the common domain marked by an "x".

As illustrated above in FIG. 15 and FIG. 16, the applied ΔT's are equal. Evidently, different types of compensations relating to e.g. the above-described error signal may be individually applied to the specific found intersections.

Moreover, it is noted that BR equals AL and BL equals AR, thus demonstrating that the desired intersections ALc, ARc, BLc and BRc may in fact be determined on the basis of determination of only two intersections, e.g. AR and AL. This may both lead to the advantage of reducing the computing related to the determination of intersections significantly, basically from four to two in this specific embodiment of the invention and may moreover result in reduced requirements with respect to noise shaping of the intersections if the intersections are noise shaped prior to transformation into the common time domain.

Figure 17:
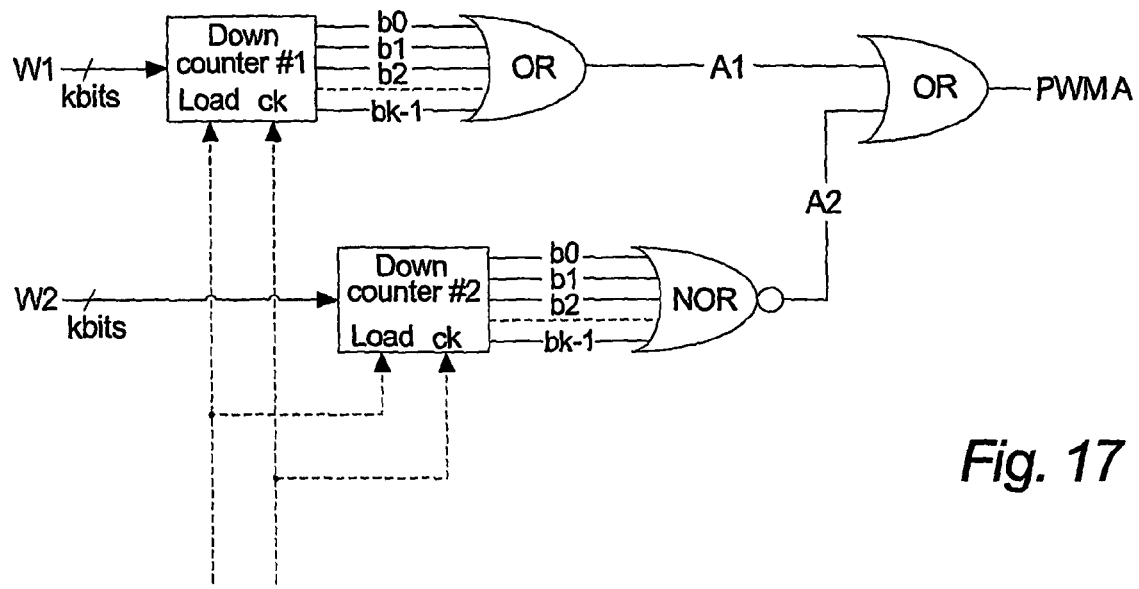

FIG. 17 illustrates an exemplary circuit used for the purpose of establishment of an output PWM signal. If true differential three-level output is needed, two of the illustrated circuits are needed. In the illustrated embodiment, two edge-determining words W1 and W2 are loaded to the counter circuit. W1 determines the first edge of the signal and W2 determines the second edge and the illustrated output PWM A-signal.

Figure 18:
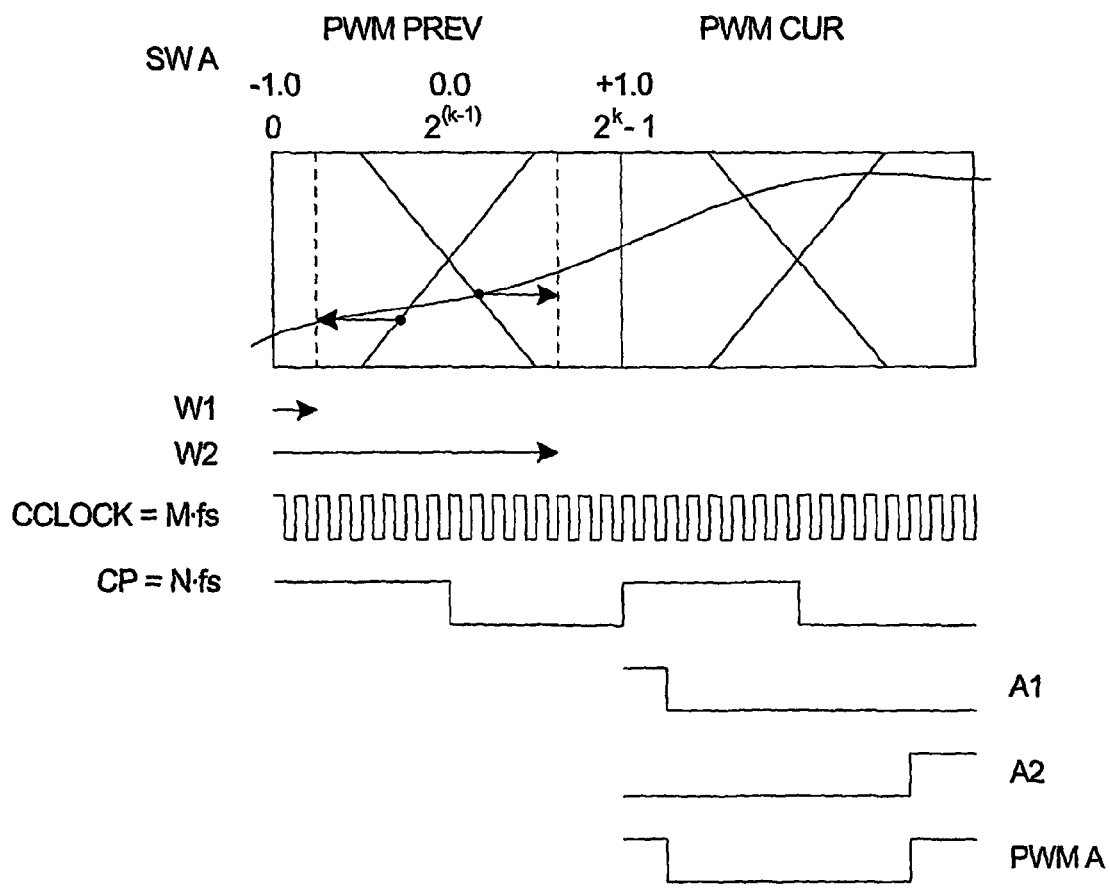

FIG. 18 illustrates a timing diagram of an embodiment of the invention in which two edge-determining data words,— e.g. established in the basis of the above-described method according to an embodiment of the invention. The words are then, e.g. by means of a counter-circuits of the above-described kind, established in the following period, PWM CUR.

The corresponding timing diagram is illustrated in FIG. 18.

The invention claimed is:

1. Method of establishing a PWM-modulated output signal representation (OS),
   providing a stream of parallelly determined intersection representations (PIR) on the basis of a stream of parallel reference signal representations (PRSR) and an input signal (IS),
   establishing a serial PWM output signal representation (OS) by transforming said stream of parallelly determined intersection representations (PIR) into a stream of serial intersection representations (SIR) by means of a relative time shift of at least one of said parallelly determined intersections (PIR).

2. Method of establishing a PWM-modulated output signal representation (OS) according to claim 1, whereby said relative time alignment is established according to a time transformation scheme.

3. Method of establishing a PWM-modulated output signal representation (OS) according to claim 2, whereby said time transformation scheme determines a serial stream of intersection estimates (SIR) and whereby said serial stream comprises frames of a predetermined number of PWM determining estimates.

4. Method of establishing a PWM-modulated output signal representation (OS) according to claim 3, whereby at least one of said predetermined number of PWM determining estimates is established on the basis of a corresponding first parallel intersection estimate being modified by a first time shift,
   whereby at least one further of said predetermined number of PWM determining estimates is established on the basis of a further corresponding parallel intersection estimate being modified by a further time shift differing from said first time shift.

5. Method of establishing a PWM-modulated output signal representation (OS) according to claim 4, whereby said first time shift is obtained by adding ΔT to said first parallel intersection estimate, said further time shift is obtained by subtracting ΔT from said further parallel intersection estimate and where said established time shifted intersection estimates result in a first PWM output signal.

6. Method of establishing a PWM-modulated output signal representation (OS) according to claim 5, whereby a further PWM output signal is obtained by establishing a first differential time shift by subtracting ΔT from said first parallel intersection estimate and establishing a further differential time shift by adding ΔT to said further parallel intersection estimate and where said established time shifted intersection estimates result in a further PWM output signal.

7. Method of establishing a PWM-modulated output signal representation (OS) according to claim 1, whereby said parallel reference signal representations (PRSR) comprise at least two geometrically linear functions and where said time transformation scheme is applied for subjecting intersection estimates obtained between said at least two geometrically linear functions and the input signal representation (IS) to at least two different time shifts, thereby transforming said intersection estimates into intersection estimates referring to the same time base.

8. Method of establishing a PWM-modulated output signal representation (OS) according to claim 1, whereby said parallel reference signal representations (PRSR) comprise two functions, preferably linear, and where said time transformation scheme is applied for subjecting intersection estimates obtained between said two functions and a differential input signal representation (IS) to four time shifts, at least two of said four shifts being mutually different, thereby transforming said intersection estimates into intersection estimates referring to the same time base.

9. Method of establishing a PWM-modulated output signal representation (OS) according to claim 1, whereby a three-level output signal is obtained by determining four intersections referring to different time bases and subsequently transforming these intersections into corresponding intersections referring to the same time base according to said time transformation scheme.

10. Method of establishing a PWM-modulated output signal representation (OS) according to claim 1, whereby a three-level output signal is obtained by determining two intersections between a parallel reference signal representation (PRSR) of a double-sided triangular reference signal and an input signal representation (ISR), transforming said two determined intersections into four intersection representations by four time shifts.

11. Method of establishing a PWM-modulated output signal representation (OS) according to claim 1, whereby said input signal representation comprises a single-ended input.

12. Method of establishing a PWM-modulated output signal representation (OS) according to claim 1, whereby said input signal representation comprises a differential input.

13. Method of establishing a PWM-modulated output signal representation (OS) according to claim 1, whereby said input signal (IS) is digitally represented.

14. Method of establishing a PWM-modulated output signal representation (OS) according to claim 1, whereby said stream of parallel reference signal representations (PRSR) is established as functions having desired properties with respect to a time axis.

15. Method of establishing a PWM-modulated output signal representation (OS) according to claim 1, whereby said stream of parallel reference signal representations (PRSR) is established on the basis of a model function (MF), which is represented in at least two different domains having mutually different time bases, one part of the model function (MF) being represented in a first domain and at least one further part being represented in a further domain.

16. Method of establishing a PWM-modulated output signal representation (OS) according to claim 15, whereby said model function (MF) is a double-sided triangular periodic signal.

* * * * *